(12) United States Patent
Sills et al.

(10) Patent No.: US 9,034,570 B2
(45) Date of Patent: May 19, 2015

(54) METHODS OF FORMING PATTERNS

(71) Applicant: Micron Technology, Inc., Boise, ID (US)

(72) Inventors: Scott E. Sills, Boise, ID (US); Gurtej S. Sandhu, Boise, ID (US); John Smythe, Boise, ID (US); Ming Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/192,410

(22) Filed: Feb. 27, 2014

(65) Prior Publication Data

US 2014/0179115 A1 Jun. 26, 2014

Related U.S. Application Data

(63) Continuation of application No. 13/710,729, filed on Dec. 11, 2012, now Pat. No. 8,703,396, which is a continuation of application No. 13/369,208, filed on Feb. 8, 2012, now Pat. No. 8,349,545, which is a continuation of application No. 12/397,083, filed on Mar. 3, 2009, now Pat. No. 8,133,664.

(51) Int. Cl.
*G03F 7/26* (2006.01)
*H01L 21/027* (2006.01)
(Continued)

(52) U.S. Cl.
CPC .............. *H01L 21/0274* (2013.01); *G03F 7/40* (2013.01); *H01L 21/0337* (2013.01); *H01L 21/0338* (2013.01); *G03F 7/20* (2013.01)

(58) Field of Classification Search
CPC ....... G03F 7/40; G03F 7/0397; G03F 7/0392; G03F 7/38; G03F 7/004; G03F 7/095; G03F 7/26; G03F 7/30; G03F 7/405; H01L 21/0337; H01L 21/0274; H01L 21/32139; H01L 21/0273; H01L 21/31144; H01L 28/09
USPC .......................................... 430/322, 325, 324
See application file for complete search history.

(56) References Cited

U.S. PATENT DOCUMENTS 5,648,198 A * 7/1997 Shibata .......................... 430/296
5,869,135 A 2/1999 Vaeth et al.
(Continued)

FOREIGN PATENT DOCUMENTS

CN 1471134 1/2004
CN 101135840 3/2008
(Continued)

OTHER PUBLICATIONS

WO PCT/US2010/023209SearchReport, Aug. 30, 2010, Micron Technology, Inc.
(Continued)

*Primary Examiner* — Caleen Sullivan
(74) *Attorney, Agent, or Firm* — Wells St. John P.S.

(57) ABSTRACT

Some embodiments include methods of forming patterns of openings. The methods may include forming spaced features over a substrate. The features may have tops and may have sidewalls extending downwardly from the tops. A first material may be formed along the tops and sidewalls of the features. The first material may be formed by spin-casting a conformal layer of the first material across the features, or by selective deposition along the features relative to the substrate. After the first material is formed, fill material may be provided between the features while leaving regions of the first material exposed. The exposed regions of the first material may then be selectively removed relative to both the fill material and the features to create the pattern of openings.

27 Claims, 9 Drawing Sheets (51) Int. Cl.
*G03F 7/40* (2006.01)
*H01L 21/033* (2006.01)
*G03F 7/20* (2006.01)

(56) References Cited

U.S. PATENT DOCUMENTS

| | | |
|---|---|---|
| 6,258,639 B1 | 7/2001 | Rohdin et al. |
| 6,548,385 B1 | 4/2003 | Lai |
| 7,176,085 B2 | 2/2007 | Jeon et al. |
| 7,312,158 B2 | 12/2007 | Miyagawa et al. |
| 7,338,874 B2 | 3/2008 | Oh et al. |
| 7,452,825 B2 | 11/2008 | Lee et al. |
| 7,576,009 B2 | 8/2009 | Lee et al. |
| 8,133,664 B2 | 3/2012 | Sills et al. |
| 8,349,545 B2 | 1/2013 | Sills et al. |
| 2005/0124135 A1 | 6/2005 | Ayazi et al. |
| 2007/0077524 A1 | 4/2007 | Koh et al. |
| 2007/0102775 A1 | 5/2007 | Kwon |
| 2007/0148968 A1* | 6/2007 | Kwon et al. ............ 438/671 |
| 2008/0057610 A1 | 3/2008 | Lee et al. |
| 2008/0061358 A1 | 3/2008 | Choi |
| 2008/0136907 A1 | 6/2008 | Lin et al. |
| 2008/0272410 A1 | 11/2008 | Lin |
| 2008/0305642 A1 | 12/2008 | Lee et al. |

FOREIGN PATENT DOCUMENTS

| | | |
|---|---|---|
| CN | 101320673 | 12/2008 |
| CN | 201080010243.3 | 7/2013 |
| JP | 2007-150166 | 6/2007 |
| JP | 2008/060517 | 3/2008 |
| JP | 2008-306161 | 12/2008 |
| KR | 10-0763538 | 10/2007 |
| KR | 10-0871967 | 12/2008 |
| TW | 099105188 | 1/2013 |
| WO | PCT/US2010/023209 | 9/2011 |

OTHER PUBLICATIONS

WO PCT/US2010/023209WrittenOpinio, Aug. 30, 2010, Micron Technology, Inc.
TW 099105188 Search Report, Jan. 7, 2013, Micron Technology, Inc.
Chen, Rong, et al., "Area Selective Atomic Layer Deposition by Soft Lithography" 2006, pp. 161-166, vol. 917, Mater. Res. Soc. Symp. Proc., Materials Research Society.
Greiner, A., et al., "Poly(p-xylylene)s: Synthesis, polymer analogous reactions, and perspectives on structure-property relationships" 1997, pp. 1-15, vol. 48, Acta Polymer.
Huang, Z., et al., "Selective deposition of films of polypyrrole and nickel on hydrophobic/hydrophilic patterned surfaces and applications" Feb. 15, 1997, pp. 1375-1376, vol. 85, Synthetic Metals.
Iwatsuki, Shouji, et al., "New Method for Preparation of Poly(phenylene-vinylene) Film" 1991, pp. 1071-1074, The Chemical Society of Japan, Chemistry Letters.
Kwak, Sung Kwan, et al., "Improvement of Selective Copper Deposition by N2 Plasma Treatment" Dec. 2001, pp. 1076-1080, vol. 39, No. 6, Journal of the Korean Physical Society.
Lee, Ming-Kwei, et al., "Selective and blanket liquid phase deposition of silicon dioxide on silicon nitride and tungsten silicide" 2003, pp. L45-L48, vol. 18, Institute of Physics Publishing, Semiconductor Science and Technology.
Sankir, Nuran D., et al., "An alternative method for selective metal deposition onto flexible materials" 2008, pp. 155-159, vol. 196, Journal of Materials Processing Technology.
Schafer, O., et al., "Poly(p-phenylenevinylene) by chemical vapor deposition: synthesis, structural evaluation, glass transition, electroluminescence, and photoluminescence" 1996, pp. 1-9, vol. 82, Synthetic Metals.
Sekiguchi, A., et al., "Micrometer patterning of phthalocyanines by selective chemical vapor deposition" Nov. 4, 1991, pp. 2466-2468, vol. 59, Issue 19, Appl. Phys. Lett.
Shirai, Masamitsu, et al., "Polysiloxane Formation at the Irradiated Polymer Surface: A Liquid-Phase Deposition Method" 1995, pp. 141-144, vol. 8, No. 1, Journal of Photopolymer Science and Technology.
Staring, E.G.J., et al., "Chemical vapour deposition of poly(1,4-phenylenevinylene) films" 1994, pp. 71-75, vol. 67, Synthethic Metals.
Tatsuura, Satoshi, et al., "Polyazomethine conjugated polymer film with second order nonlinear optical properties fabricated by electric-field-assisted chemical vapor deposition", May 3, 1993, pp. 2182-2184, vol. 62, Issue 18, Appl. Phys. Lett.
Vaeth, Kathleen M. et al., "Chemical vapor deposition of poly (p-phenykene vinylene) based light emitting diodes with low turn-on voltages" Oct. 13, 1997, pp. 2091-2093, vol. 77, Appl. Phys. Lett.
Vaeth, Kathleen, et al., "Chemical Vapor Deposition of Thin Films Used in Polymer-Based Light Emitting Diodes" May 1997, pp. 490-493, vol. 9, Issue 6, Advanced Materials.
Weaver, M.S., et al., "Organic electroluminescence devices fabricated with chemical vapour deposited polyazomethine films" Oct. 1996, pp. 61-66, vol. 83, Synthetic Metals.
Wen, Weng-Kou, et al., "Single-layer organic electroluminescent devices by vapor deposition polymerization" Sep. 8, 1997, pp. 1302-1304, vol. 71, Issue 10, Appl. Phys. Lett.

* cited by examiner

FIG. 18

US 9,034,570 B2

METHODS OF FORMING PATTERNS

RELATED PATENT DATA

This patent is a continuation of and claims priority to U.S. patent application Ser. No. 13/710,729, which was filed Dec. 11, 2012, which is a continuation of and claims priority to U.S. patent application Ser. No. 13/369,208, which was filed Feb. 8, 2012, which is now U.S. Pat. No. 8,349,545, which is a continuation of and claims priority to U.S. patent application Ser. No. 12/397,083, which was filed Mar. 3, 2009, which is now U.S. Pat. No. 8,133,664, the disclosures of which are hereby incorporated herein by reference.

TECHNICAL FIELD

The technical field is methods of forming patterns, such as, for example, methods of forming masking patterns over semiconductor substrates.

BACKGROUND

Numerous applications exist in which it is desired to form repeating patterns having a very short pitch. For instance, integrated circuit fabrication may involve formation of a repeating pattern of memory-storage units (i.e., NAND unit cells, dynamic random access [DRAM] unit cells, cross-point memory unit cells, etc.).

Integrated circuit fabrication may involve formation of a patterned mask over a semiconductor substrate, followed by transfer of a pattern from the mask into the substrate with one or more etches. The pattern imparted into the substrate may be utilized to form individual components of integrated circuitry.

The patterned mask may comprise photolithographically-patterned photoresist. Multiple separate photomasks (or reticles) may be utilized in photolithographically creating a desired masking pattern in photoresist. A problem that may occur is that each photomasking step introduces risks of mask misalignment. Another problem is that each photomasking step is another step in a fabrication process, which can increase costs and reduce throughput relative to fabrication processes having fewer steps.

A continuing goal of integrated circuit fabrication is to increase integrated circuit density, and accordingly to decrease the size of individual integrated circuit components. There is thus a continuing goal to form patterned masks having increasing densities of individual features. In cases in which the patterned masks comprise repeating patterns of features, there is a continuing goal to form the repeating patterns to higher density, or in other words to decreasing pitch. It would be desired to develop new methods of forming patterns which enable repeating patterns to be formed to high density.

There is also a continuing goal to reduce costs and increase throughput. It is thus desired to develop methods of forming patterns which enable repeating patterns to be formed with relatively few photomasking steps.

DETAILED DESCRIPTION OF THE ILLUSTRATED EMBODIMENTS

Some embodiments include methods of forming patterns of openings over semiconductor substrates. The openings may be subsequently utilized for patterning one or more materials of the semiconductor substrates. For instance, the openings may be utilized for patterning DRAM components, NAND components, SRAM components, etc.

The embodiments may include formation of photolithographically-patterned features over the substrate, and subsequent utilization of the features to align a sacrificial spacer material. Some of the sacrificial spacer material may then be removed to leave the pattern of openings over the substrate. In some embodiments, the sacrificial spacer material may comprise a metal. For instance, the sacrificial spacer material may comprise a metallo-organic composition. In some embodiments, the spacer material may be spin-cast across the features. In such embodiments, the spacer material may be dispersed in a solution having an appropriate viscosity so that the spacer material may be provided uniformly and conformally across the features. For instance, the metallo-organic composition may be dispersed in a fluid having propylene glycol and/or one or more propylene glycol derivatives to an amount sufficient to create an appropriate viscosity for conformal deposition of the metallo-organic composition.

Example embodiments are described with reference to FIGS. 1-18.

Figure 1:
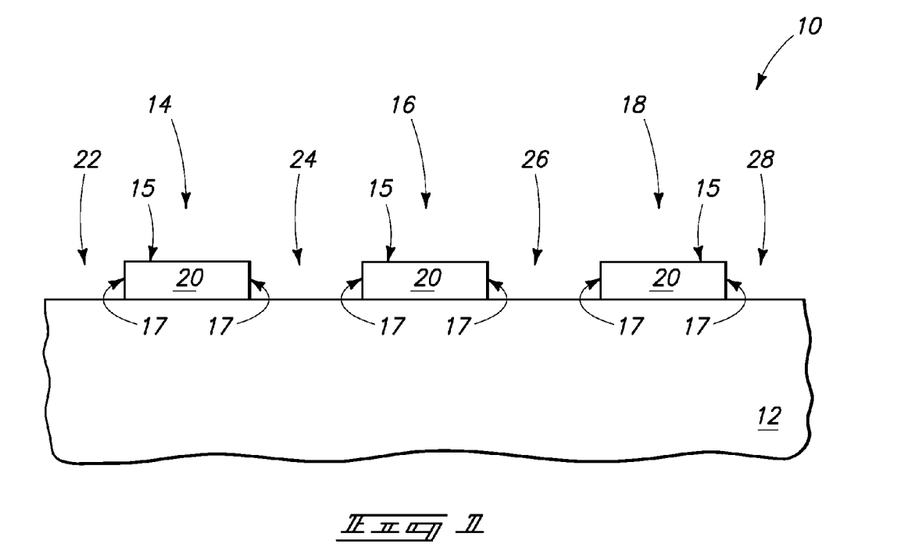
FIGS. 1-9 are diagrammatic cross-sectional views of a portion of a semiconductor wafer shown at various process stages of an embodiment.

FIG. 1 shows a portion of a semiconductor construction 10. The semiconductor construction includes a semiconductor substrate 12 having a plurality of spaced features 14, 16 and 18 thereover.

Semiconductor substrate 12 may comprise, consist essentially of, or consist of, for example, monocrystalline silicon lightly-doped with background p-type dopant. The terms "semiconductor construction", "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In some embodiments the substrate may be a reticle substrate, and specifically may be a substrate that is to be incorporated into a reticle or photomask.

The semiconductor substrate may be homogeneous, or may comprise any of numerous layers and materials associated with integrated circuit (IC) and/or micro electromechanical system (MEMS) fabrication. For instance, the semiconductor substrate may comprise multiple layers and materials associated with DRAM fabrication, NAND fabrication, and/or SRAM fabrication.

Features 14, 16 and 18 comprise a material 20. Material 20 may be any suitable composition or combination of compositions, and in some embodiments may comprise, consist essentially of or consist of organic polymer (for instance, material 20 may comprise, consist essentially of, or consist of one or more of photoresist, polystyrene and polymethylmethacrylate). If material 20 consists of photoresist, features 14, 16 and 18 may be formed by initially forming a layer of photoresist over a surface of substrate 12, and then using a photomask to photolithographically pattern the photoresist and thereby create the features. If material 20 comprises a composition other than photoresist, the features 14, 16 and 18 may be formed by initially forming a layer of material 20 over a surface of substrate 12, forming a photolithographically-patterned photoresist mask over the layer, and then transferring a pattern from the mask into the layer to create features. Although the features 14, 16 and 20 are shown to be homogeneous, in other embodiments the features may comprise two or more different materials.

Features 14, 16 of 18 are spaced from one another by gaps 22, 24, 26 and 28. Such gaps extend to an upper surface of substrate 12.

The individual features have top surfaces 15, and sidewall surfaces 17 extending from the top surfaces to an upper surface of substrate 12.

Figure 2:
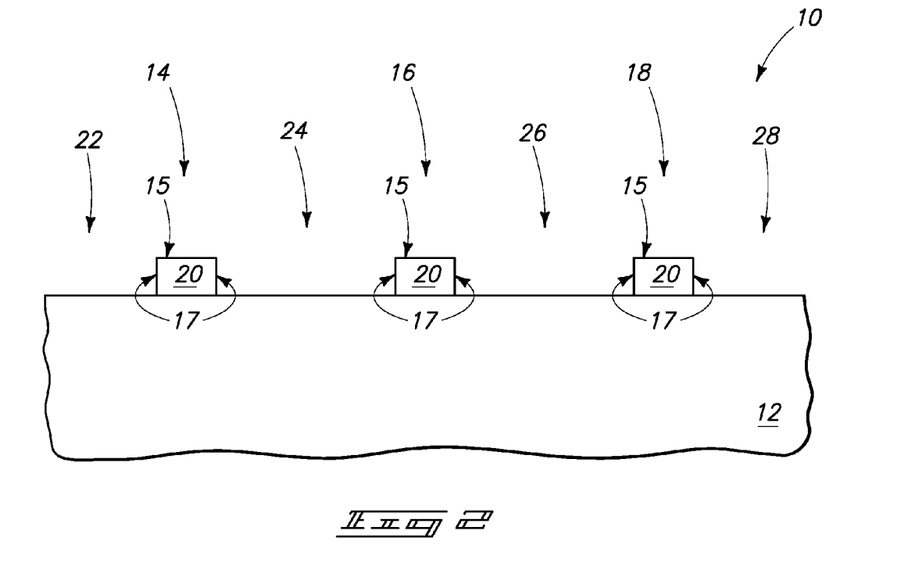

Referring next to FIG. 2, features 14, 16 and 18 are laterally trimmed to reduce the lateral dimensions of such features along an illustrated cross-section. In other words, features 14, 16 and 18 have a first lateral width at the processing stage of FIG. 1, and are then subjected to processing to reduce such lateral width to the second lateral width which is illustrated in FIG. 2. The lateral trimming extends the widths of gaps 22, 24, 26 and 28 along the illustrated cross-section.

The lateral trimming of features 14, 16 and 18 may be accomplished utilizing any suitable processing. For instance, if features 14, 16 and 18 consist of photoresist (or other organic polymer), the lateral trimming may be accomplished utilizing an $O_2$-based plasma. In some embodiments the lateral trimming may utilize the $O_2$-based plasma in combination with one or more passivation additives (e.g., $CH_2F_2$). In other embodiments, the lateral trimming may utilize wet chemical processing techniques that remove the outermost portion of material 20. Example wet chemistry that may be used for the lateral trimming may comprise an initial acid treatment of the outermost portions of material 20, followed by solubilization of the acid-treated regions in an aqueous base (for instance, tetramethyl ammonium hydroxide).

Although the laterally-trimmed features of FIG. 2 are shown to be rectangular blocks, in some embodiments the lateral trimming may create other geometric shapes. For instance, the lateral trimming may transform features 14, 16 and 18 of FIG. 1 into dome-shaped features.

The laterally-trimmed features 14, 16 and 18 of FIG. 2 retain top surfaces 15 and sidewall surfaces 17, but the locations of at least some of such surfaces are shifted in the laterally-trimmed features relative to the locations of such surfaces prior to the lateral trimming.

The lateral trimming of features 14, 16 and 18 may be omitted in some embodiments, and accordingly the processing stage of FIG. 2 may be omitted in some embodiments.

If features 14, 16 and 18 are an organic polymer (which may or may not be photoresist, and in some embodiments may comprise, consist essentially of, or consist of one or both of polystyrene and polymethylmethacrylate), the features may be treated to render them insoluble during subsequent spin casting of a material 30 (discussed below with reference to FIG. 3), if the features would be soluble in a solvent of the cast solution.

If features 14, 16 and 18 are an organic polymer (which may or may not be photoresist, and in some embodiments may comprise, consist essentially of, or consist of photoresist), such features may be treated to render them inert to chemistry utilized during subsequent lateral trimming of additional organic polymer (such subsequent lateral trimming may occur at, for example, a processing stage described below with reference to FIG. 7). The treatment may comprise, for example, formation of a thin layer of protective material (not shown) along exposed surfaces of features 14, 16 and 18; inducement of a chemical change (such as chemical cross-linking) throughout the features 14, 16 and 18; and/or inducement of a chemical change along exposed outer surfaces of the features (such as through exposure to halogen in a plasma). In some embodiments, at least some of the treatment of the features may occur during formation and/or treatment of the material 30 (discussed below with reference to FIG. 3). For example, if the treatment of the features comprises cross-linking, at least some of such cross-linking may be induced during a heat treatment (for instance, a bake) of material 30 utilized to convert material 30 to a metal oxide (discussed below).

Figure 3:
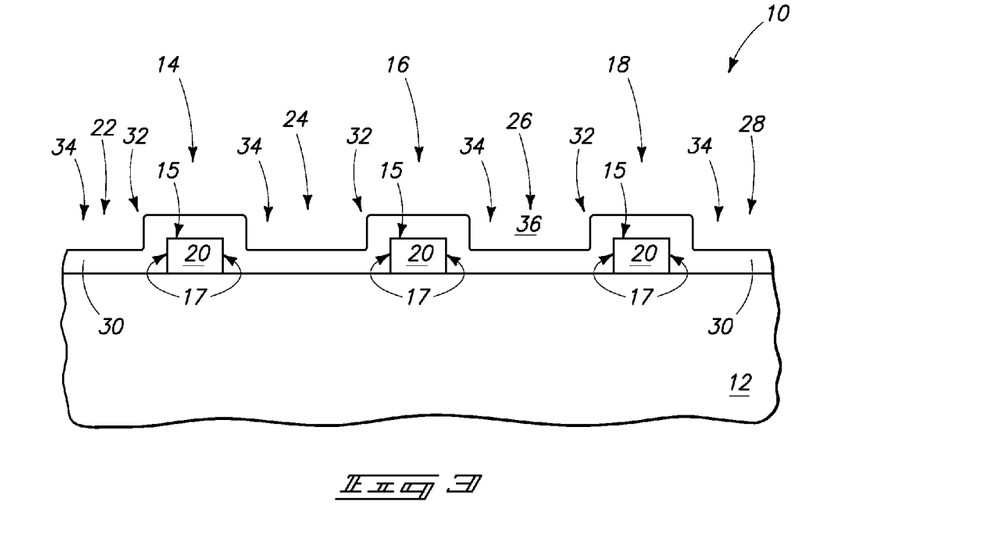

Referring to FIG. 3, the material 30 is formed over features 14, 16 and 18, and within the gaps 22, 24, 26 and 28 between the features. Material 30 is conformal relative to the features, and accordingly has an undulating topography comprising peaks 32 over the features, and comprising valleys 34 within the gaps between the features.

In some embodiments, material 30 may correspond to a spin-cast layer. The layer is formed by spin-casting a mixture having a suitable viscosity to form the shown conformal layer. The viscosity may be adjusted by including propylene glycol and/or one or more propylene glycol derivatives within the mixture utilized for the spin-casting. An example propylene glycol derivative is propylene glycol monomethyl ether acetate. In some embodiments, the mixture utilized for spin-casting may comprise a metallo-organic dispersed in a solution that contains propylene glycol and/or one or more propylene glycol derivatives. For instance, the solution may comprise a titanium-containing metallo-organic dispersed in a solution containing propylene glycol monomethyl ether acetate to a concentration of from about 1 weight percent to about 5 weight percent. If the spin-cast material includes a titanium-containing metallo-organic, such metallo-organic may be subsequently treated under conditions that convert at least some of the titanium to titanium oxide; and in some embodiments may be treated under conditions that transform an entirety of material 30 to titanium oxide. Such conditions may include a heat treatment, such as, for example, treatment at a temperature of from about 80° C. to about 140° C. Such heating may form the titanium oxide through sol-gel reactions.

Material 30 may be formed to any suitable thickness, and in some embodiments may be formed to a thickness of less than or equal to about 50 nanometers, less than or equal to about 40 nanometers, less than or equal to about 30 nanometers, or even less than or equal to about 20 nanometers.

Material 30 may be referred to as a sacrificial material, in that some of the material is subsequently removed to form openings extending to substrate 12 (with such removal being described below with reference to FIG. 6).

Figure 4:
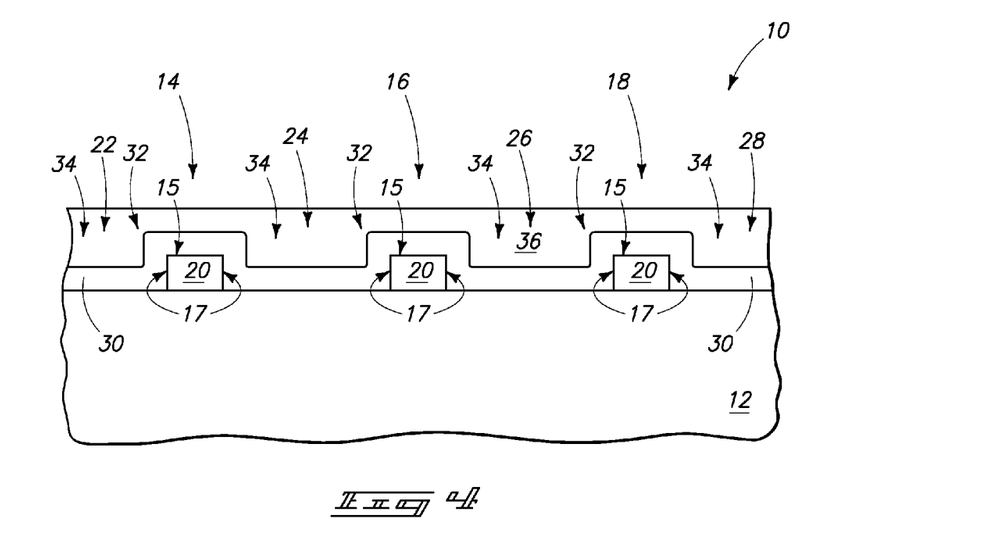

Referring to FIG. 4, a fill material 36 is formed over material 30. The fill material fills the valleys 34 of the undulating topography of material 30, and in the shown embodiment also covers the peaks 32 of such undulating topography. Material 36 may comprise any suitable material, and in some embodiments may comprise, consist essentially of, or consist of an organic polymer. In some embodiments, material 36 may comprise, consist essentially of, or consist of one or more of photoresist, polystyrene and polymethylmethacrylate.

Figure 5:
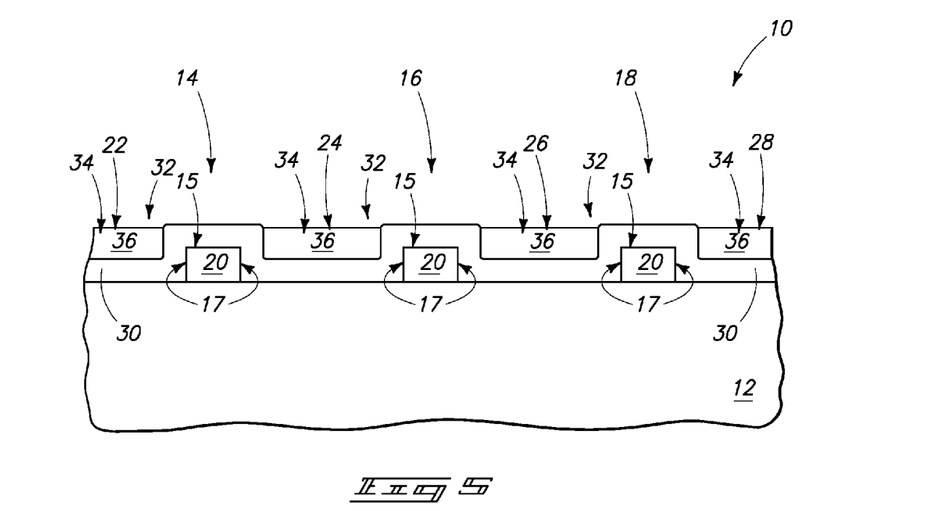

Referring to FIG. 5, construction 10 is subjected to processing which removes material 36 from over peaks 32 of the undulating topography of material 30, while leaving material 36 within the valleys 34 of such undulating topography. The processing may comprise an etch and/or may comprise planarization. In the shown embodiment, the removal of material 36 has caused an upper surface of material 36 to be recessed relative to the upper surface of material 30. In other embodiments (not shown), the upper surface of material 36 may not be recessed relative to the upper surface of material 30 after removal of some of material 36, but may instead be flush with the upper surface of material 30, or above the upper surface of material 30. The fill material 36 remaining at the processing stage of FIG. 5 fills the valleys 34 of the undulating topography of material 30, while leaving the peaks 32 of such undulating topography exposed.

Figure 6:
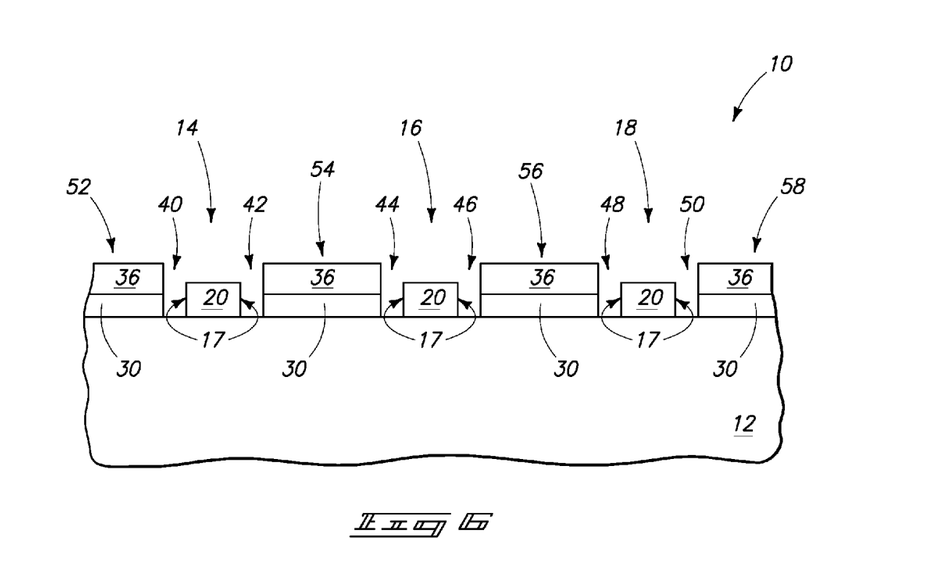

Referring to FIG. 6, exposed portions of material 30 are selectively removed relative to a surface of substrate 12, and relative to materials 20 and 36, to create openings 40, 42, 44, 46, 48 and 50 extending to the upper surface of substrate 12. The removal of material 30 may comprise an anisotropic etch. In embodiments in which material 30 is an oxide, the surface of substrate 12 consists of silicon, and materials 20 and 36 are photoresist, the selective removal of material 30 may utilize fluorine-based chemistry.

The formation of openings 40, 42, 44, 46, 48 and 50 results in creation of a plurality of additional features 52, 54, 56 and 58 which alternate with the original features 14, 16 and 18.

The openings 40, 42, 44, 46, 48 and 50 correspond to a pattern of openings formed across a substrate 12. In subsequent processing, the pattern of such openings may be utilized during fabrication of one or more IC components within substrate 12. For instance, dopant may be implanted through the openings to form a desired dopant pattern within substrate 12 and/or an etch may be conducted through the openings to transfer a desired pattern into substrate 12. Alternatively, additional processing may be conducted relative to materials 36 and 30 to alter the pattern of the openings. For instance, FIG. 7 shows construction 10 after fill material 36 has been subjected to conditions which reduce a lateral width of the fill material along the illustrated cross-section.

If the fill material 36 is photoresist, the conditions utilized for reducing the lateral width of the fill material may correspond to photolithographic patterning of the fill material and/or to lateral trimming of the fill material with $O_2$-based plasma chemistry or with wet chemistry. In embodiments in which material 20 is photoresist, the treatment of material 20 discussed above with reference to FIG. 2 for rendering material 20 inert during lateral trimming may enable features 14, 16 and 18 to remain substantially unchanged during the lateral trimming of fill material 36.

Figure 8:
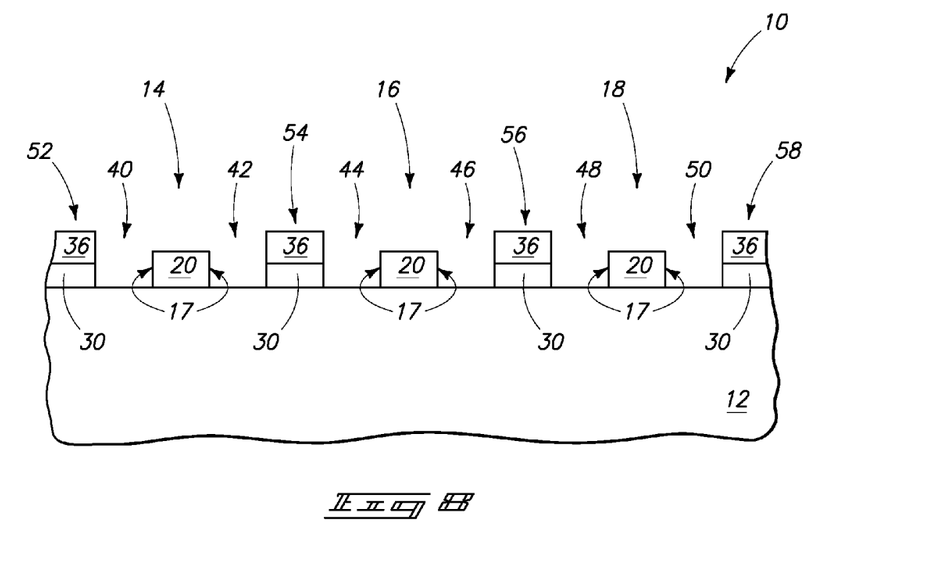

The reduction of the lateral width of fill material 36 exposes portions of material 30 within the additional features 52, 54, 56 and 58. FIG. 8 shows construction 10 after such portions are removed, which effectively corresponds to lateral trimming of regions of material 30 within the additional features 52, 54, 56 and 58. The lateral trimming of materials 30 and 36 results in lateral trimming of the additional features 52, 54, 56 and 58, and lateral expansion of the openings 40, 42, 44, 46, 48 and 50 along the shown cross-section. Although the additional features 52, 54, 56 and 58 are shown to be approximately centered between features 14, 16 and 18, in other embodiments the additional features may be offset within the gaps between features 14, 16 and 18. Also, although the additional features 52, 54, 56 and 58 are shown to have about the same widths as features 14, 16 and 18, in other embodiments the additional features may have different widths than the initial features 14, 16 and 18. Additionally, although the shown embodiment forms only one additional feature between each of the original features 14, 16 and 18 (to accomplish pitch doubling), in other embodiments multiple additional features may be formed between the original features so that an original pitch may be tripled, quadrupled, etc.

In some embodiments, the processing of FIGS. 3-8 has aligned the additional features 52, 54, 56 and 58 with the original features 14, 16 and 18, without utilization of additional photomasking steps besides the step used to initially form the features 14, 16 and 18 (i.e., the photomasking described with reference to FIG. 1.). This may reduce risks of mask misalignment relative to processing utilizing additional photomasks, and may also improve throughput relative to processing utilizing additional photomasks.

Figure 9:
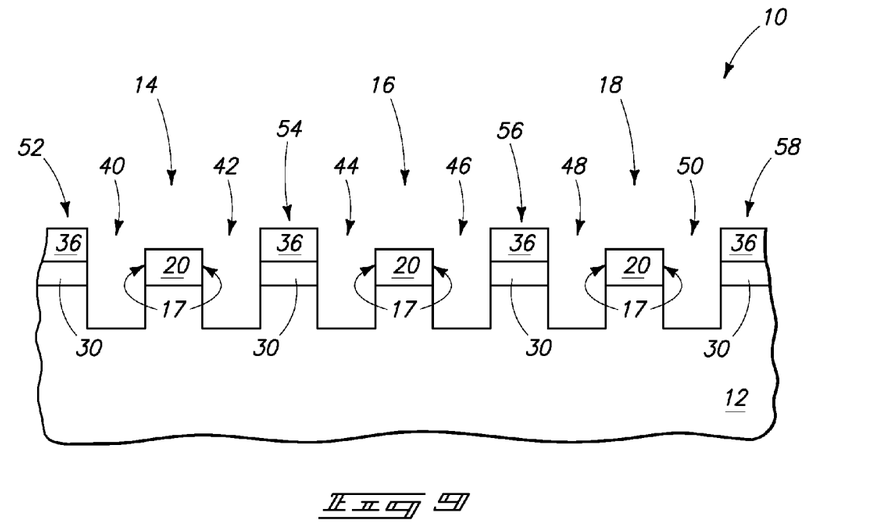

The openings 40, 42, 44, 46, 48 and 50 are together a pattern of openings extending across the substrate 12. The pattern of such openings may be utilized for creating a desired pattern within the underlying substrate 12. For instance, FIG. 9 shows construction 10 after an etch has been utilized to extend openings 40, 42, 44, 46, 48 and 50 into substrate 12. The formation of the pattern within substrate 12 may correspond to patterning of various components associate with DRAM, SRAM and/or NAND. For instance, the patterning may be utilized to create NAND gates within substrate 12.

Although FIG. 9 shows construction 10 after openings 40, 42, 44, 46, 48 and 50 have been used during etching into substrate 12, in other embodiments the openings may be used for other processing alternatively to, or additionally to, the etching. For instance, openings 40, 42, 44, 46, 48 and 50 may be utilized to define locations for deposition of dopant within substrate 12.

Figure 10:
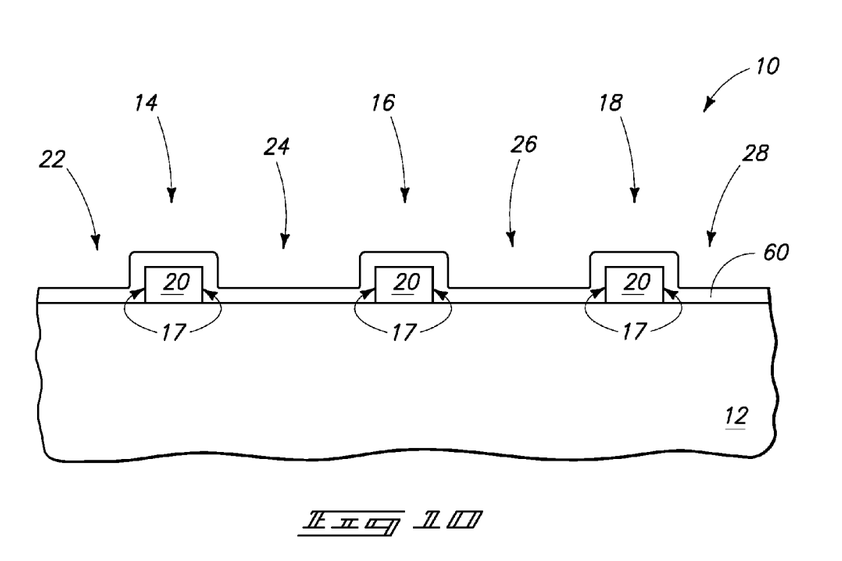
FIGS. 10-12 are diagrammatic cross-sectional views of a portion of a semiconductor wafer shown at various process stages of an embodiment. The process stage of FIG. 10 is subsequent to that of FIG. 2, and alternative to that of FIG. 3.
Figure 11:
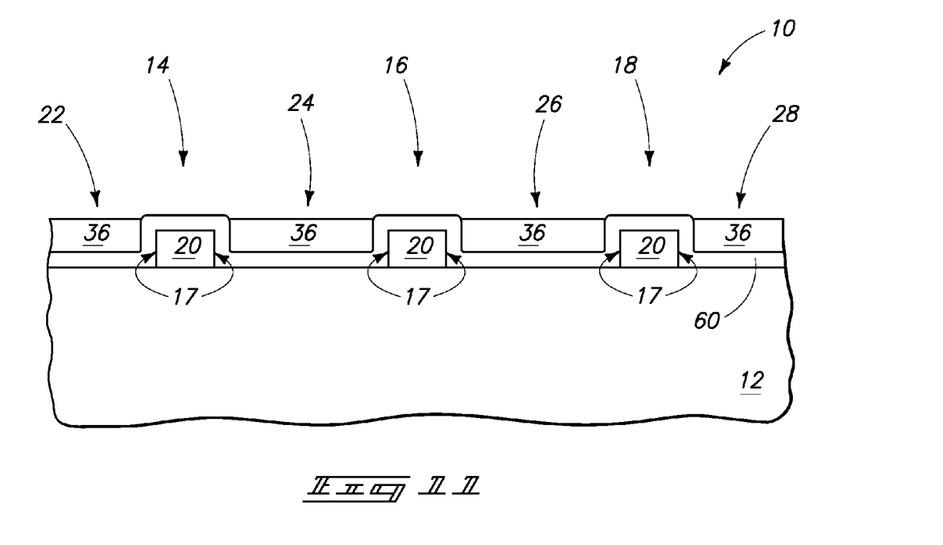
Figure 12:
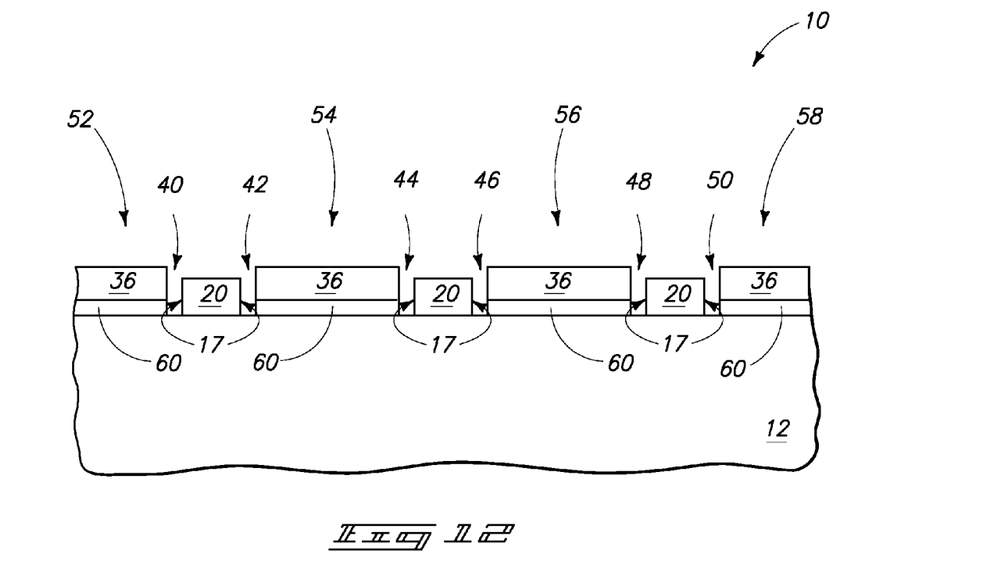

The initial size of openings 40, 42, 44, 46, 48 and 50 (i.e., the size of the openings at the processing stage of FIG. 6) may be determined by the thickness of the conformal sacrificial material utilized during formation of the openings (e.g., the material 30 utilized in the embodiment of FIGS. 3-6). FIGS. 10-12 illustrate an embodiment of the invention similar to that of FIGS. 3-6, but in which a different thickness of conformal material is utilized to create the openings.

Referring to FIG. 10, construction 10 is shown at a processing stage subsequent to that of FIG. 2, and alternative to that of FIG. 3. Specifically, FIG. 10 shows construction 10 at a processing stage in which a relatively thin layer of conformal material 60 is formed across features 14, 16 and 18, and across the gaps 22, 24, 26 and 28 between features. Material 60 may comprise any suitable composition, and may, for example, comprise any of the compositions discussed above relative to material 30. Material 60 may be formed by spin-casting in a manner analogous to that discussed above regarding the spin-casting of material 30.

Referring to FIG. 11, fill material 36 is formed within the gaps 22, 24, 26 and 28, and the construction is shown at a processing stage in which the material 60 over features 14, 16 and 18 is exposed. Such processing stage may be analogous to that discussed above with reference to FIG. 5, and may be formed with processing analogous to that discussed above with reference to FIGS. 4 and 5.

Referring to FIG. 12, exposed regions of material 60 are removed to form openings 40, 42, 44, 46, 48 and 50; and to also form the features 52, 54, 56 and 58 comprising materials 60 and 36. The openings 40, 42, 44, 46, 48 and 50 at the processing stage of FIG. 12 are narrower than analogous openings at the processing stage of FIG. 6, due to material 60 being thinner than material 30. The processing of FIGS. 3-6 and 9-11 illustrates that lateral widths of openings 40, 42, 44, 46, 48 and 50 may be tailored by tailoring a thickness of a conformal material utilized during creation of the openings.

The processing of FIGS. 1-12 utilizes conformal materials (30 are 60) formed across features (14, 16 and 18) and across the gaps between the features (gaps 22, 24, 26 and 28). If subsequent processing is utilized to expand openings formed along features 14, 16 and 18 (for instance, the processing described above with reference to FIGS. 7 and 8 for expanding openings 40, 42, 44, 46, 48 and 50), such processing laterally etches both a fill material (36), and a conformal material underlying the fill material (for instance, the conformal material 30 of FIGS. 7 and 8). It may be advantageous in some embodiments to avoid forming the conformal material across the gaps between features 14, 16 and 18 so that lateral etching of such conformal material may be avoided in subsequent processing. FIGS. 13-18 illustrate an example embodiment in which conformal material is formed selectively along features 14, 16 and 18, relative to formation across an exposed surface of substrate 12.

Figure 13:
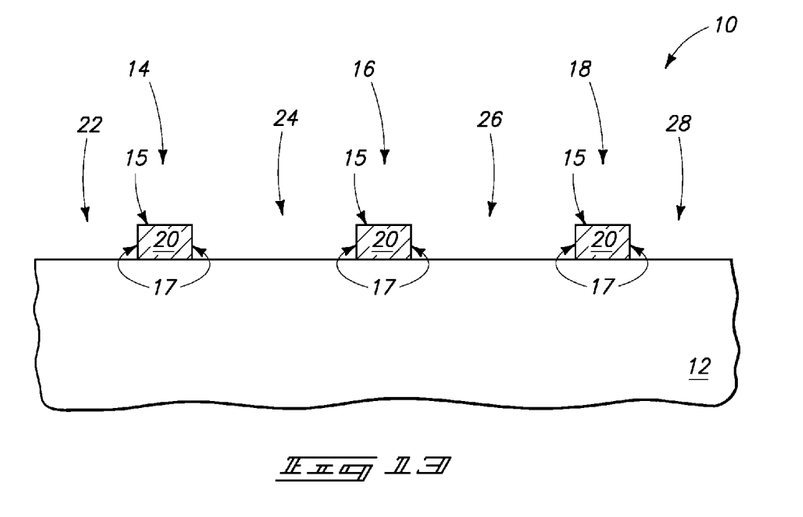
FIGS. 13-18 are diagrammatic cross-sectional views of a portion of a semiconductor wafer shown at various process stages of an embodiment. The process stage of FIG. 13 is subsequent to that of FIG. 2.

Referring to FIG. 13, construction 10 is shown at a processing stage analogous to that of FIG. 2. The construction includes the features 14, 16 and 18, spaced from one another by gaps 22, 24, 26 and 28. The features are shown with crosshatching to assist in identifying the features at subsequent processing stages. The crosshatching is not being used to indicate the composition of the features, and specifically is not being used to indicate that the features 14, 16 and 18 of FIG. 13 are different than those of FIG. 2.

Figure 14:
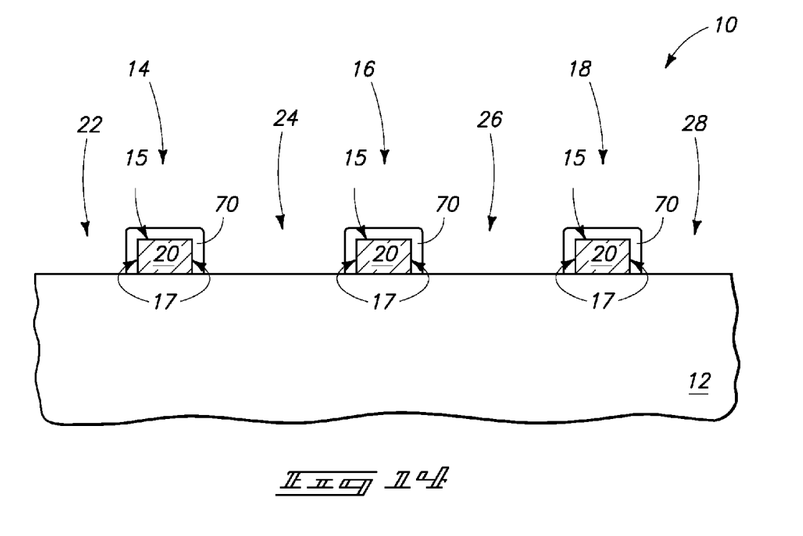

Referring to FIG. 14, a conformal material 70 is selectively formed along the top and sidewall surfaces 15 and 17 of the features 14, 16 and 18, relative to an exposed surface of substrate 12. Thus, the conformal material extends along the surfaces of features 14, 16 and 18, but does not extend across the majority of the surface of substrate 12 within gaps 22, 24, 26 and 28. There is some amount of substrate 70 along the surface 12 within such gaps, however, due to the material 70 extending laterally outwardly from sidewall surfaces 17 of the features 14, 16 and 18.

Material 70 may be formed by any suitable method, and in some embodiments may be formed by selective atomic layer deposition (ALD), selective vapor depositions, etc. In order to obtain precise control of the dimensions of small features, it may be desired that material 70 be deposited with self-limiting deposition techniques, such as, for example, ALD or similar. The precise control of thickness and conformality that may be afforded by such techniques may enable material 70 to be deposited to within tight tolerances, which may enable optimized control of critical dimensions utilized in pattern formation.

The compositions of material 20, the upper surface of substrate 12 and material 70 may be chosen to enable material 70 to be selectively deposited on surfaces of material 20 relative to the upper surface of substrate 12. In some example embodiments, material 20 of the features 14, 16 and 18 may comprise photoresist, the upper surface of substrate 12 may comprise silicon, and material 70 may comprise polysiloxane (utilizing methodologies analogous to those described by Shirai et. al., Journal of Photopolymer Science and Technology, Volume 8, pp 141-144 (1995)). In some example embodiments, material 20 of the features 14, 16 and 18 may comprise titanium nitride, the upper surface of substrate 12 may comprise borophosphosilicate glass, and material 70 may comprise copper (utilizing methodologies analogous to those described by Park et. al., Journal of the Korean Physical Society, Volume 39, pp 1076-1080 (2001)). In some example embodiments, material 70 may comprise selectively-deposited metal (utilizing methodologies analogous to those described by Sankir et. al., Journal of Materials Processing Technology, Volume 196, pp 155-159 (2008)). In some example embodiments, material 70 may comprise selectively-deposited silicon dioxide (utilizing methodologies analogous to those described by Lee et. al., Semicond. Sci Technol., Volume 18, pp L45-L48 (2003)). In some example embodiments, material 70 may comprise selectively-deposited HFO (utilizing methodologies analogous to those described by Chen et. al., Mat. Res. Soc. Symp. Proc., Volume 917, pp 161-166 (2006)). In some example embodiments, material 70 may comprise selectively-deposited polymer (utilizing methodologies analogous to those described in U.S. Pat. No. 5,869,135).

Figure 15:
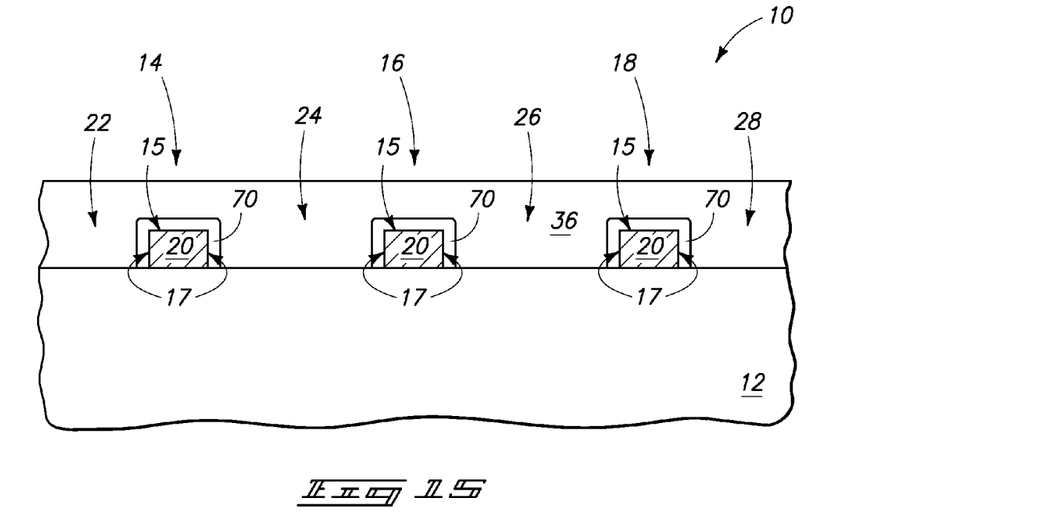

Referring to FIG. 15, fill material 36 is formed over material 70 and within the gaps 22, 24, 26 and 28 between features 14, 16 and 18.

Figure 16:
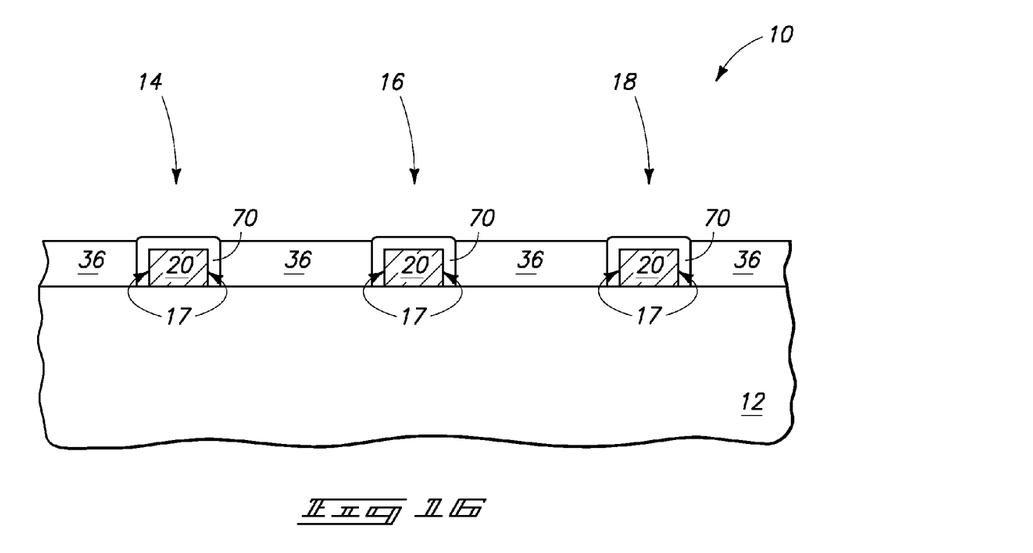

Referring to FIG. 16, some of the material 36 is removed to expose the material 70 over features 14, 16 and 18. Such removal may be accomplished utilizing processing analogous to that discussed above with reference to FIGS. 4 and 5.

Figure 17:
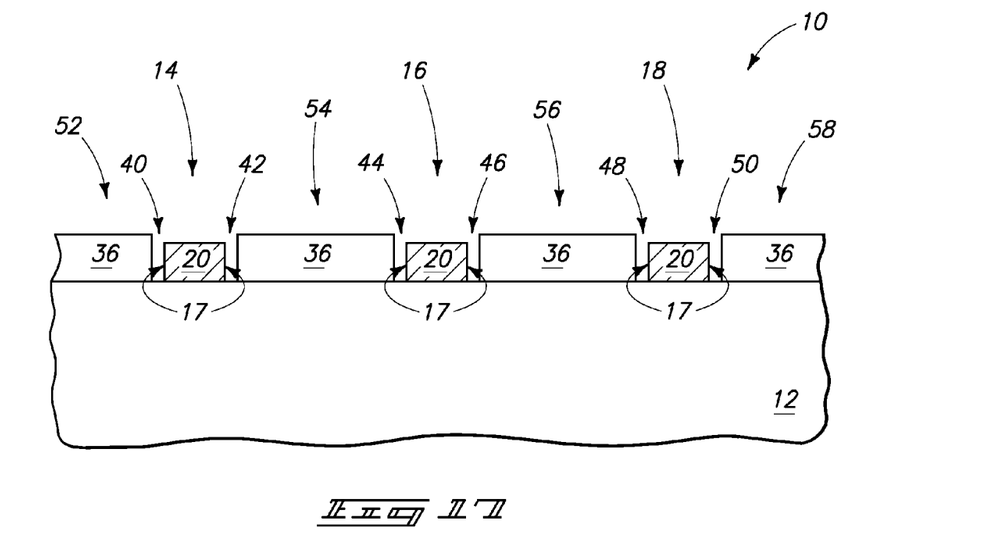

Referring to FIG. 17, material 70 is removed to form openings 40, 42, 44, 46, 48 and 50 extending to substrate 12. The removal of material 70 is selective relative to materials 20 and 36, as well as relative to a material along the upper surface of substrate 12 in the shown embodiment. Such selective removal may be accomplished with any suitable processing. The formation of openings 40, 42, 44, 46, 48 and 50 leaves a plurality of features 52, 54, 56 and 58, with such features consisting of fill material 36.

Figure 18:
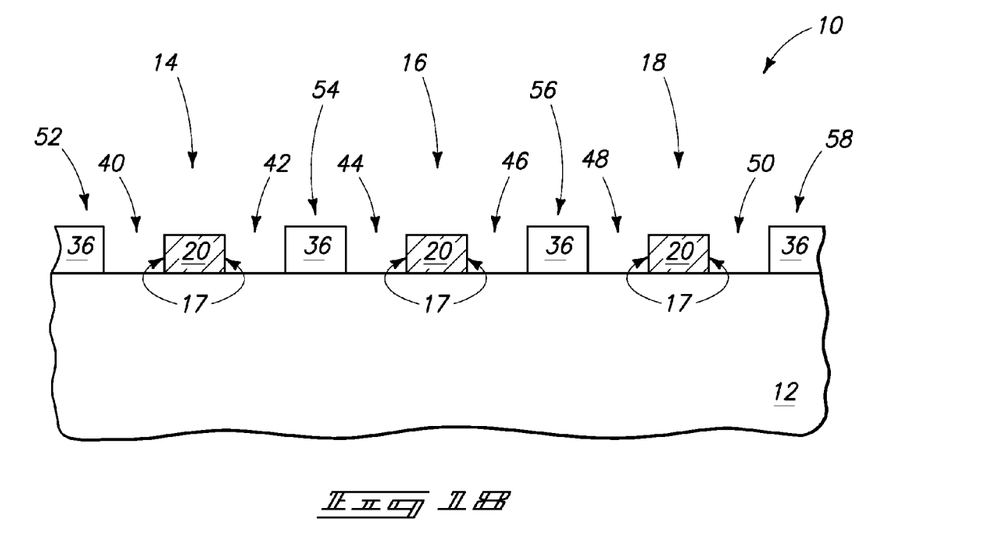

Referring to FIG. 18, features 52, 54, 56 and 58 are reduced in lateral width along the shown cross-section, resulting in lateral expansion of openings 40, 42, 44, 46, 48 and 50. If material 36 comprises photoresist, the reduction in lateral width of features 52, 54, 56 and 58 may be accomplished with photolithographic processing and/or with the lateral trim methodologies discussed above with reference to FIG. 2.

Figure 7:
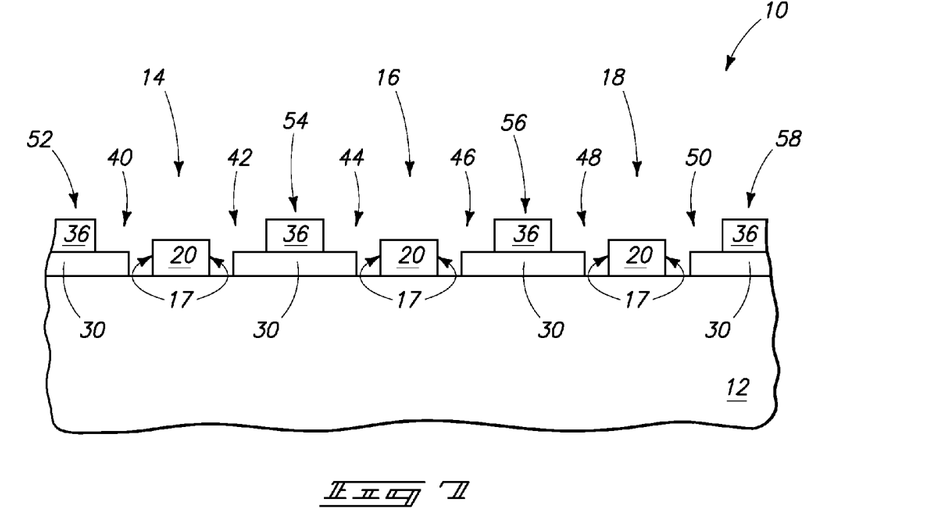

A difference between the processing of FIGS. 17 and 18 relative to that of FIGS. 6-8 is that only material 36 is removed in the processing of FIGS. 17 and 18, rather than the removal of materials 36 and 30 in the processing of FIG. 6-8. Such may provide an advantage to utilization of the processing of FIGS. 13-18 relative to that of FIGS. 6-8 in some embodiments, in that it may remove at least one process step.

The openings 40, 42, 46, 48 and 50 may be utilized for subsequent processing of substrate 12, analogous to the processing discussed above with reference to FIG. 9.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern of openings comprising:
providing a plurality of initial features having sidewalls over a substrate;
providing spacer material adjacent to the sidewalls of the initial features;
forming a plurality of additional features over the substrate after the providing the spacer material, wherein the spacer material aligns the additional features with the initial features;
removing portions of the spacer material which are between the initial and additional features to create the pattern of openings intermediate the initial and additional features; and
reducing widths of the additional features after the removing.

2. The method of claim 1 wherein the providing the spacer material comprises forming a conformal layer of the spacer material over the initial features, and the forming the additional features comprises:
   forming a layer of fill material over the conformal layer; and
   removing some of the fill material.

3. The method of claim 2 wherein the conformal layer has a plurality of peaks over the initial features and a plurality of valleys intermediate the peaks, and wherein the removing comprises removing portions of the fill material over the peaks.

4. The method of claim 2 wherein the additional features comprise the spacer material and the fill material.

5. The method of claim 1 wherein the providing the spacer material comprises spin-casting a layer of the spacer material over the substrate.

6. The method of claim 5 further comprising treating the initial features to render them insoluble during the spin-casting the layer of the spacer material.

7. The method of claim 1 wherein the providing the spacer material comprises depositing the spacer material.

8. The method of claim 7 further comprising depositing the spacer material to a desired thickness to control a lateral spacing of the additional features from the initial features.

9. The method of claim 1 wherein the providing the spacer material comprises forming a layer of the spacer material over the initial features and adjacent to the sidewalls of the initial features, and a thickness of the spacer material laterally aligns the additional features with the initial features.

10. The method of claim 1 wherein the initial and additional features comprise an organic polymer, and the spacer material comprises a metal-containing material.

11. The method of claim 1 further comprising reducing widths of the initial features before the providing the spacer material.

12. The method of claim 1 further comprising processing regions of the substrate which are exposed by the openings.

13. A method of forming a pattern of openings comprising:
   providing a plurality of initial features over a substrate;
   aligning a plurality of additional features with the initial features using spacer material;
   removing portions of the spacer material which are between the initial and additional features to create the pattern of openings intermediate the initial and additional features; and
   wherein the initial and additional features comprise an organic polymer, and the spacer material comprises a metal-containing material.

14. The method of claim 13 wherein the additional features comprise the spacer material.

15. The method of claim 13 further comprising forming a conformal layer of the spacer material over the initial features and adjacent to sidewalls of the initial features, and further comprising forming the additional features comprising:
   forming a layer of fill material over the conformal layer; and
   removing some of the fill material, and wherein the additional features comprise the spacer material and the fill material.

16. The method of claim 15 wherein a thickness of the conformal layer of the spacer material defines a lateral spacing of the additional features from the initial features.

17. The method of claim 13 further comprising depositing the spacer material to a desired thickness to control a lateral spacing of the additional features from the initial features.

18. A method of forming a pattern of openings comprising:
   providing a plurality of initial features over a substrate;
   treating the initial features to render them insoluble during subsequent spin-casting of a layer;
   spin-casting the layer over the initial features and adjacent to sidewalls of the initial features;
   forming a plurality of additional features over the substrate; and
   removing material of the spin-cast layer which is between the initial and additional features to create the pattern of openings between the initial and additional features.

19. The method of claim 18 wherein the removed material of the spin-cast layer aligned the additional features with the initial features.

20. The method of claim 18 wherein the forming the additional features comprises:
   forming a layer of fill material over the spin-cast layer; and
   removing some of the fill material.

21. The method of claim 20 wherein the additional features comprise material of the spin-cast layer and the fill material.

22. The method of claim 20 wherein the spin-cast layer has a plurality of peaks over the initial features and a plurality of valleys intermediate the peaks, and the removing comprises removing the some of the fill material which is over the peaks.

23. The method of claim 18 wherein the spin-casting comprises spin-casting the layer to a desired thickness to control a lateral spacing of the additional features from the initial features.

24. The method of claim 18 wherein a thickness of the spacer materials laterally aligns the additional features with the initial features.

25. The method of claim 18 wherein the initial and additional features comprise an organic polymer, and the spin-cast layer comprises a metal-containing material.

26. A method of forming a pattern of openings comprising:
   providing a plurality of initial features having sidewalls over a substrate;
   providing spacer material adjacent to the sidewalls of the initial features;
   forming a plurality of additional features over the substrate after the providing the spacer material, wherein the spacer material aligns the additional features with the initial features;
   removing portions of the spacer material which are between the initial and additional features to create the pattern of openings intermediate the initial and additional features; and
   wherein the initial and additional features comprise an organic polymer, and the spacer material comprises a metal-containing material.

27. A method of forming a pattern of openings comprising:
   providing a plurality of initial features having sidewalls over a substrate;
   providing spacer material adjacent to the sidewalls of the initial features;
   forming a plurality of additional features over the substrate after the providing the spacer material, wherein the spacer material aligns the additional features with the initial features;
   removing portions of the spacer material which are between the initial and additional features to create the pattern of openings intermediate the initial and additional features; and
   reducing widths of the initial features before the providing the spacer material.

* * * * *